(12) United States Patent
Huang et al.

(10) Patent No.: US 9,786,647 B1
(45) Date of Patent: Oct. 10, 2017

(54) SEMICONDUCTOR LAYOUT STRUCTURE

(71) Applicant: UNITED MICROELECTRONICS CORP., Hsin-Chu (TW)

(72) Inventors: Chun-Hsien Huang, Tainan (TW); Yung-Feng Cheng, Kaohsiung (TW); Yu-Tse Kuo, Tainan (TW); Chia-Wei Huang, Kaohsiung (TW); Li-Ping Huang, Miaoli County (TW); Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/092,630

(22) Filed: Apr. 7, 2016

(51) Int. Cl.
  *H01L 23/528* (2006.01)
  *H01L 23/522* (2006.01)
  *H01L 27/11* (2006.01)
  *H01L 27/02* (2006.01)

(52) U.S. Cl.
  CPC ........ *H01L 27/0207* (2013.01); *H01L 23/528* (2013.01); *H01L 23/5226* (2013.01); *H01L 27/1104* (2013.01)

(58) Field of Classification Search
  CPC . H01L 23/528; H01L 23/5226; H01L 27/1104
  See application file for complete search history.

(56) References Cited

U.S. PATENT DOCUMENTS

| | | | | |
|---|---|---|---|---|
| 7,701,034 B2* | 4/2010 | Chuang | ............. | H01L 21/82343 257/288 |
| 8,410,571 B2* | 4/2013 | Hou | ...................... | H01L 23/522 257/459 |
| 8,957,459 B2* | 2/2015 | Morimoto | ........... | H01L 27/0207 257/206 |
| 2005/0274983 A1* | 12/2005 | Hayashi | .............. | H01L 27/0207 257/206 |
| 2009/0315079 A1* | 12/2009 | Tien | ..................... | H01L 27/0207 257/207 |
| 2011/0147765 A1* | 6/2011 | Huang | .............. | H01L 21/28123 257/77 |
| 2015/0091188 A1* | 4/2015 | Lee | ..................... | H01L 27/0207 257/774 |
| 2015/0243667 A1* | 8/2015 | Liaw | ................... | H01L 27/1104 257/390 |
| 2017/0141110 A1* | 5/2017 | Wang | .................... | H01L 27/092 |

OTHER PUBLICATIONS

Hung, Title of Inventor: Novel Dummy Gate Technology to Avoid Shorting Circuti, U.S. Appl. No. 14/742,589, filed Jun. 17, 2015

* cited by examiner

*Primary Examiner* — Jarrett Stark
*Assistant Examiner* — Charles N Ausar-El
(74) *Attorney, Agent, or Firm* — Winston Hsu

(57) ABSTRACT

A semiconductor layout structure includes a substrate comprising a cell edge region and a dummy region abutting thereto, a plurality of dummy contact patterns disposed in the dummy region and arranged along a first direction, and a plurality of dummy gate patterns disposed in the dummy region and arranged along the first direction. The dummy contact patterns and the dummy gate patterns are alternately arranged. Each dummy contact pattern includes an inner dummy contact proximal to the cell edge region and an outer dummy contact distal to the cell edge region, and the inner dummy contact and the outer dummy contact are arranged along a second direction perpendicular to the first direction and spaced apart from each other by a first gap.

9 Claims, 15 Drawing Sheets

SEMICONDUCTOR LAYOUT STRUCTURE

BACKGROUND OF THE INVENTION

1. Field of the Invention

The present invention relates to a semiconductor layout structure, and more particularly, to a semiconductor layout structure for static random access memory (hereinafter abbreviated as SRAM) cells.

2. Description of the Prior Art

In recent years, with widespread use of mobile terminal equipment, digital signal processing in which bulk data such as sounds or images is processed at high speed has been increasingly important. SRAM, which is capable of high-speed access processing, holds an important place as a semiconductor memory device to be mounted on such mobile terminal equipment.

Each of SRAM cells include a bistable circuit, which does not require refreshing. The switching speed of each bistable circuit is determined by the resistance and capacitance of the control electrodes of the transistors and the connection of the transistors within the circuit, thereby determining the slew rate of its output voltage. In addition to the desirability of forming larger numbers of SRAM cells and arrays on a chip of reasonable size, there is substantial incentive toward size reduction and integrated density increase in each cell.

SRAM memory cells and arrays are fabricated by forming metal contacts such as word line contacts, bit line contacts, VSS contacts and VCC contacts, etc., over transistors to electrically connect these SRAM memory cells and arrays together and ensure normal read and write operations. Word line contacts are electrically connected by higher interconnect layer(s) such as first metal (M1) layer of an interconnection structure; bit line contacts are electrically connected by higher interconnect layer(s) such as M1, first via (V1) layer and second metal layer (M2) of the interconnection structure.

In applying prior design layout rules, however, problems arose during the fabrication of high-density small-sized SRAM cell arrays: Due to pattern density effect, after patterning, the sizes of metal contact holes at or near a dummy edge cell are larger than the sizes of other metal contact holes within the dense area of a bit cell. Or, it is found that the end of the line patterns are spontaneously enlarged and such phenomenon is referred to line-end effect. What's more adverse is that optical proximity correction (hereinafter abbreviated as OPC) will even enlarge the sizes of these metal contact holes because they are near iso area (the area with relative lower pattern density). As a result, the enlarged contact will contact the dummy gate and thus electrical current may go short through the dummy gate. Such kind of undesirable electrical short is extremely damaging to the formed circuit devices.

Therefore, there is still a need for an improved design layout for the SRAM cell arrays.

SUMMARY OF THE INVENTION

According to an aspect of the present invention, a semiconductor layout structure is provided. The semiconductor layout structure includes a substrate comprising a cell edge region and a dummy region abutting thereto, a plurality of dummy contact patterns disposed in the dummy region and arranged along a first direction, and a plurality of dummy gate patterns disposed in the dummy region and arranged along the first direction. The dummy contact patterns and the dummy gate patterns are alternately arranged. Each dummy contact pattern includes an inner dummy contact proximal to the cell edge region and an outer dummy contact distal to the cell edge region, and the inner dummy contact and the outer dummy contact are arranged along a second direction perpendicular to the first direction and spaced apart from each other by a first gap.

According to the semiconductor layout structure provided by the present invention, the dummy gate patterns and the dummy contact patterns are alternately arranged. More important, each dummy contact pattern includes the inner dummy contact and the outer dummy contact. In other words, the dummy contact patterns are sectioned, respectively. Accordingly, in the case that the outer dummy contact is enlarged by OPC during the fabrication process or due to line-end effect/pattern density effect, a short circuit is formed by the outer dummy contact and the dummy gate pattern. However, the short circuit formed by the outer dummy contact and the dummy gate pattern is isolated by the first gap. Consequently, no impact will be introduced into the circuit devices formed in the cell edge region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawing illustrating steps for forming a semiconductor layout structure provided by a first preferred embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-10 are schematic drawing illustrating steps for forming a semiconductor layout structure provided by a second preferred embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

FIGS. 11-15 are schematic drawing illustrating steps for forming a semiconductor layout structure provided by a third preferred embodiment of the present invention, wherein FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14.

DETAILED DESCRIPTION

Figure 1:
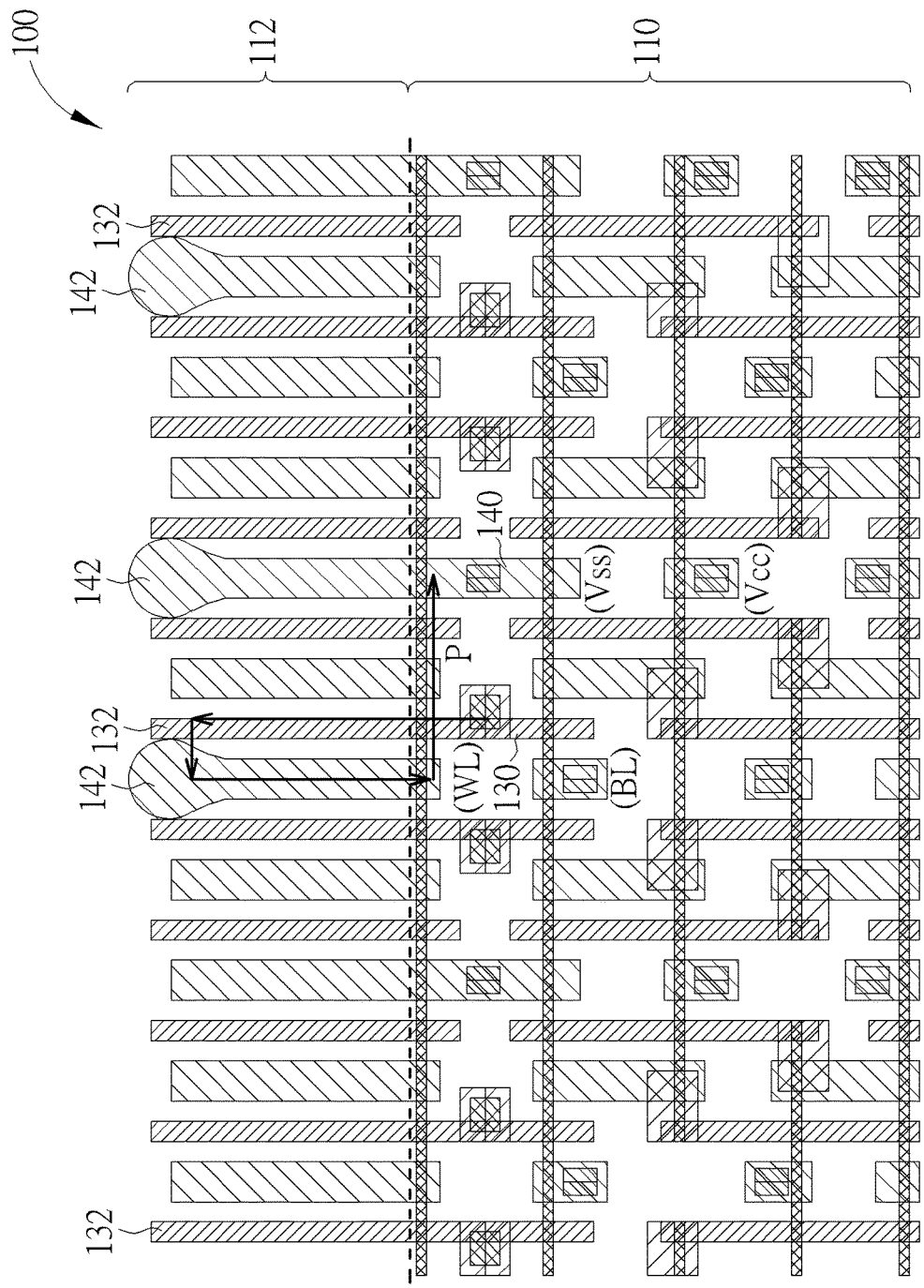
FIG. 1 is a schematic drawing illustrating an exemplary layout of a portion of a SRAM array.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Embodiments of the present invention provide a semiconductor layout structure. It is noteworthy that according to the present invention, the abovementioned semiconductor layout structure can be a semiconductor layout structure for SRAM cells, particularly for six-transistor SRAM (hereinafter abbreviated as 6T-SRAM) cells. It is well-known to those skilled in the art that a 6T-SRAM cell includes two pull-up transistors, two pull-down transistors, and two access transistors. These six transistors constitute a set of flip-flops, and the pull-up transistors and pull-down transistors constitute a latch that stores data in the storage node.

Conventionally, the pull-up transistors of the 6T-SRAM cell are p-type metal oxide semiconductor (pMOS) transistors while the pull-down transistors and the access transistors are n-type metal oxide semiconductor (nMOS) transistors. One of the pull-up transistors and one of the pull-down transistors are electrically connected in series to constitute an inverter. One end of this inverter is electrically connected to a Vcc line and the other end is electrically connected to a Vss line. Equally, the other pull-up transistor and the other pull-down transistor are electrically connected in series to constitute another inverter. One end of this inverter is electrically connected to the Vcc line and the other end is electrically connected to the Vss line. The gates of the access transistors are electrically connected to a word line (WL) that determines whether the current SRAM cell is selected or not, and sources of the access transistors are electrically connected to a bit line (BL). The SRAM cell is power through the positive power supply line Vcc, and the power supply line Vss may be an electrical ground. It is therefore conceivable that the SRAM memory cells and arrays are fabricated by forming metal contacts such as word line contacts, bit line contacts, Vss contacts and Vcc contacts, etc., over transistors to electrically connect these SRAM memory cells and arrays together and ensure normal read and write operations.

Please refer to FIG. 1 which is a schematic drawing illustrating an exemplary layout structure of a portion of a SRAM array 100. Specifically, FIG. 1 illustrates the portion of the SRAM array near a boundary of a cell region where the SRAM array locates and is therefore referred to a cell edge region 110, and a dummy region 112. A plurality of SRAM cells are arranged in an array in the cell edge region 110, and a plurality of dummy gate lines 132 and a plurality of dummy contacts 142 are disposed in the dummy region 112. It is found that the sizes of those metal contact holes at or near an edge of the dummy region 112 are larger than the sizes of other metal contact holes within the dense area like cell edge region 110. And the sizes of these metal contact holes are often enlarged by OPC because they are near iso area. As a result, the dummy contact 142 becomes too close to the neighboring dummy gate line 132, and even contacts the dummy gate line 132. Thus an electrical current may undesirably goes short from the gate line 130 (which is electrically connected to the WL) in the cell edge region 110 to a contact 140 (which is electrically connected to Vss) in the cell edge region 110 via a path "P" through the dummy gate line 132 and the dummy contact 142 in the dummy region 112. Such kind of undesirable electrical short is extremely damaging to the formed circuit devices.

Please refer to FIGS. 2-5, which are schematic drawing illustrating steps for forming a semiconductor layout structure provided by a first preferred embodiment of the present invention. It should be noted that conventional planar MOS transistor has difficulty when scaling down to 65 nm and beyond. Therefore the non-planar transistor technology such as Fin Field effect transistor (hereinafter abbreviated as FinFET) technology that allows smaller size and higher performance is developed to replace the planar transistor. Accordingly, the semiconductor layout structure provided by the preferred embodiment is exemplarily provided to form IC structure including non-planar FET device such as FinFET device, but not limited to this.

Figure 2:
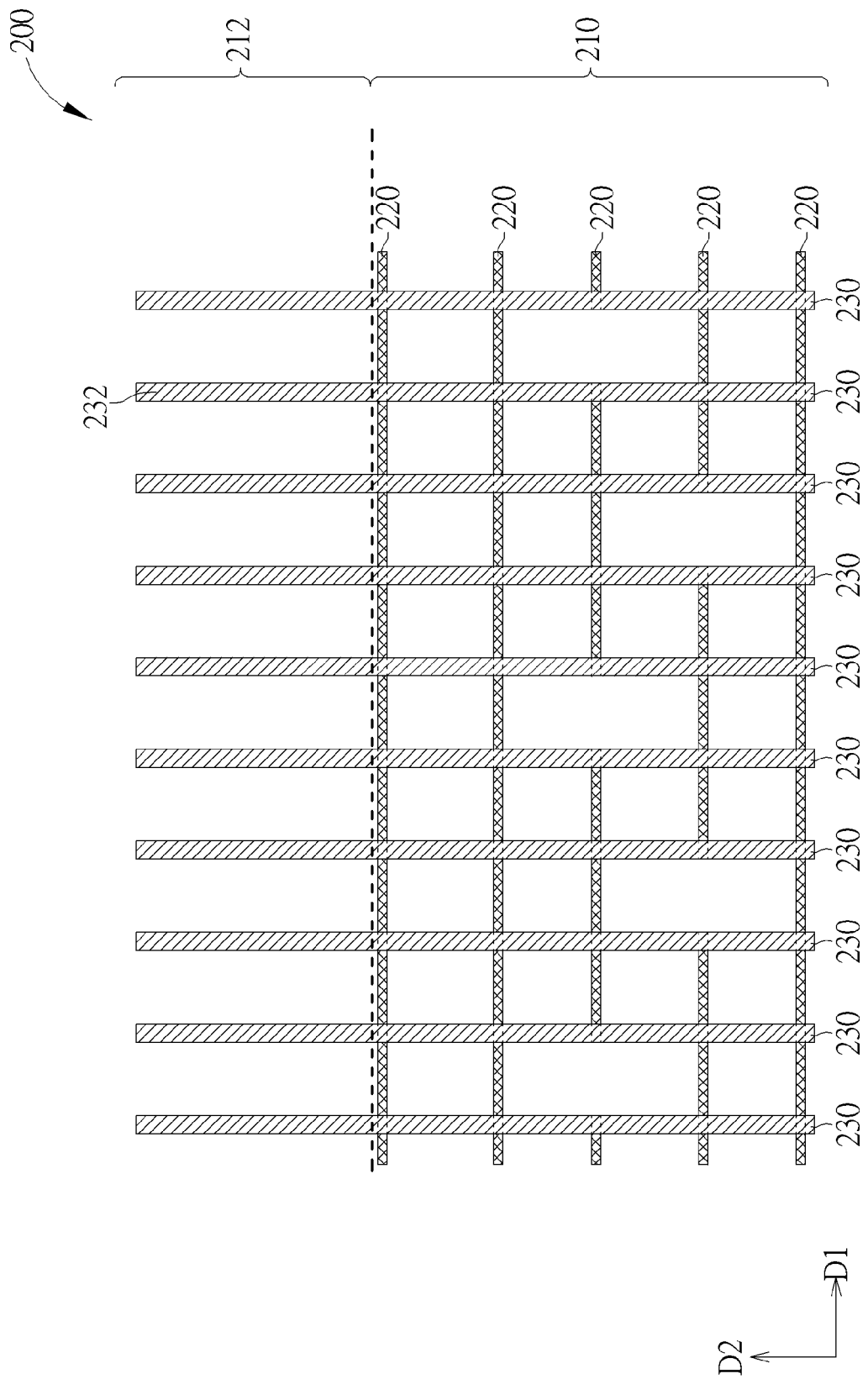

Please refer to FIG. 2. According to the preferred embodiment, a substrate 200 is provided. The substrate 200 include a silicon-on-insulator (hereinafter abbreviated as SOI) substrate. It is well-known to those skilled in the art that the SOI substrate upwardly includes a silicon substrate, a bottom oxide (BOX) layer, and a semiconductor layer such as a single crystalline silicon layer formed on the BOX layer. Additionally, the substrate 200 provided by the preferred embodiment also can include a bulk silicon substrate. Furthermore, in some embodiments of the present invention, the substrate 200 may include another elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

The substrate 200 includes a cell region (not shown) and a dummy region 212 defined thereon. A portion of the cell region which is abutting to the dummy region 212 is referred to a cell edge region 210, and FIG. 2 shows a portion of the substrate 200 near the boundary of the cell edge region 210 and the dummy region 212.

Next, a patterned hard mask (not shown) is formed on the substrate 200 to define placement and size of a plurality of fins for non-planar FET devices. In some embodiments of the present invention, a fin pitch of the fins to be formed is beyond the capability of current single exposure lithography system and technology, and thus the multiple patterning process, such as a double patterning process can be used to form the patterned hard mask defining the placement and the size for the fins. In some embodiments of the present invention, the double patterning process such as, for example but not limited to, SADP process is used. Consequently, a plurality of fin patterns 220 are formed in the cell region (not shown) and the cell edge region 210. As shown in FIG. 2, the fin patterns 220 are all extended along a first direction D1 and arranged along a second direction D2, and the first direction D1 and the second direction D2 are perpendicular to each other.

Please still refer to FIG. 2. After forming the fin patterns 220, the patterned hard mask can be removed or left on the substrate 200 depending on different product and/or process requirements. Thereafter, a plurality of patterns 230/232 are formed on the substrate 200. The patterns 230/232 can be formed by single or multiple patterning process depending on different product and/or process requirements, and those details are omitted herein in the interest of brevity. As shown in FIG. 2, the patterns 230/232 are extended along the second direction D2 and arranged along the first direction D1. Please note that the patterns disposed in the cell region and the cell edge region 210 are defined as gate patterns 230 while the patterns disposed in the dummy region 212 are defined as dummy gate patterns 232 though the gate patterns 230 and the dummy gate patterns 232 may contact each other at the boundary of the cell edge region 210 and the dummy region 212, and thus to form continuous structures, respectively, as shown in FIG. 2. Furthermore, the gate patterns 230 cross the fin patterns 220 and thus overlap a portion of the fin patterns 220. The gate patterns 230 and dummy gate patterns 232 respectively include a gate dielectric layer (not shown) and a gate conductive layer (not shown). The gate dielectric layer includes the conventional dielectric material such as silicon oxide (SiO), silicon nitride (SiN), or silicon oxynitride (SiON). In some embodiments of the present invention, the gate dielectric layer can include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer includes the high-K dielectric material, the embodiments of the present invention can be further integrated to the metal gate process. Therefore control gate compatible to the high-K gate dielectric layer is obtained. Accordingly, the gate conductive layer can include different materials according to the gate-first or gate-last process. In some embodiments of the present invention which is integrated with gate-first process, the gate conductive layer includes metal such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer can be a single-layered or multi-layered structure. In some embodiments of the present invention which is integrated with the gate-last process, the gate conductive layer serves as a dummy gate and includes semiconductor material such as polysilicon.

Figure 3:
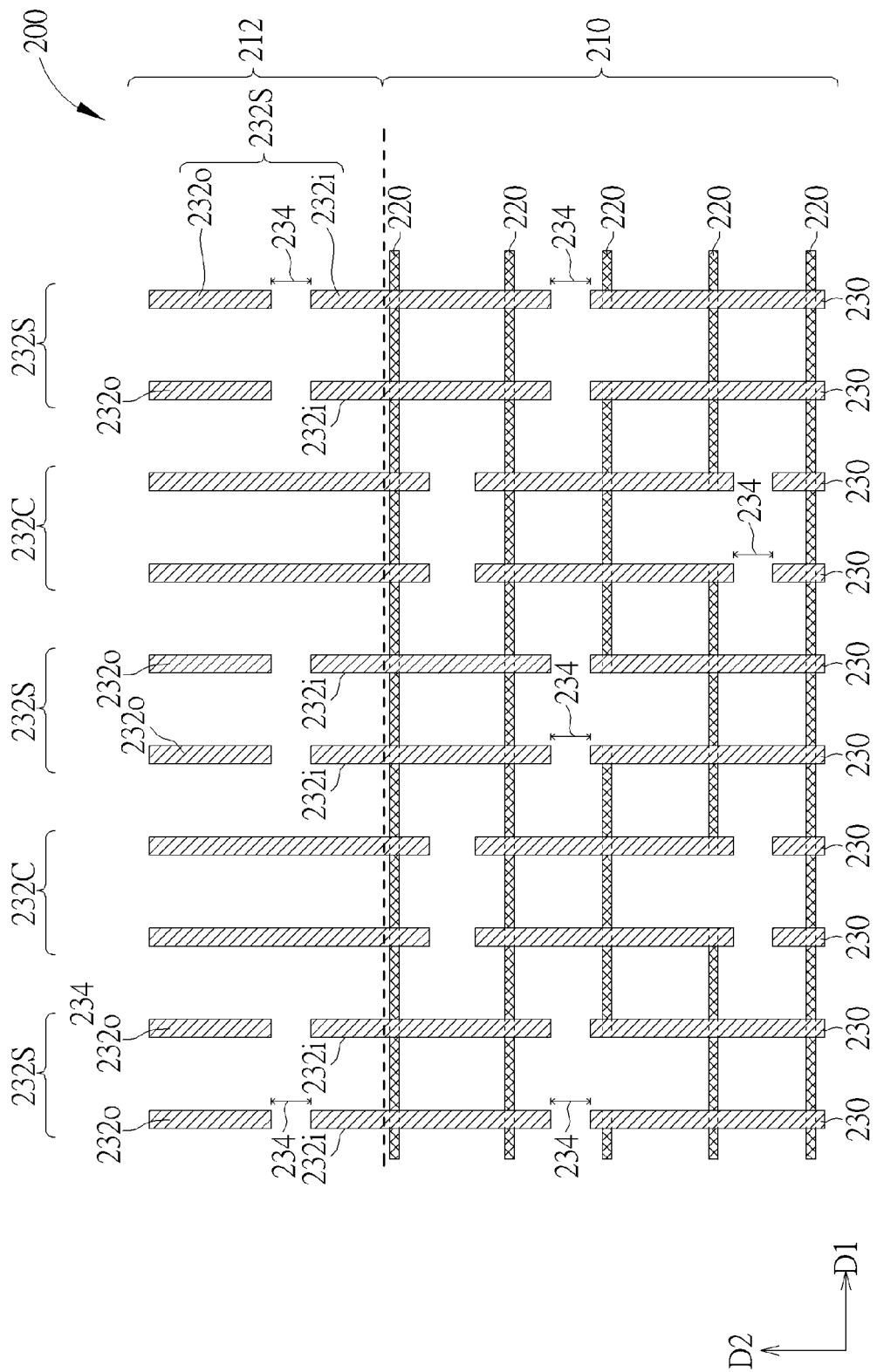

Please refer to FIG. 3. After forming the gate patterns 230 and the dummy gate patterns 232, a plurality of gaps 234 are formed to section the gate patterns 230 and the dummy gate patterns 232. It is noteworthy that in the dummy region 212, some dummy gate patterns 232 are sectioned while the others are not. Consequently, a plurality of sectioned dummy gate pairs 232S and a plurality of continuous dummy gate pairs 232C are obtained. More important, the sectioned dummy gate pairs 232S and the continuous dummy gate pairs 232C are alternately arranged pair by pair as shown in FIG. 3. Furthermore, in each sectioned dummy gate pair 232S, the dummy gate patterns 232 are sectioned to form an inner dummy gate 232i and an outer dummy gate 232o arranged along the second direction D2. As shown in FIG. 3, the inner dummy gate 232i is proximal to the cell edge region 210 while the outer dummy gate 232o is distal to the cell edge region 210. In other words, in each sectioned dummy gate pair 232S, the inner dummy gate 232i is always disposed in between the cell edge region 210 and the outer dummy gate 232o. Furthermore, the inner dummy gate 232i contacts the gate pattern 230 in the cell edge region 210, respectively. As shown in FIG. 3, the gate patterns 230 in the cell region and the cell edge region 210 are spaced apart from each other by the gaps 234. And a width of the gaps 234 between the gate patterns 232 is equal to a width of the gaps 234 between the inner dummy gate 232i and the outer dummy gate 232o.

After forming the gate patterns 230 and the dummy gate patterns 232, elements such as source/drain extension regions, spacers, and source/drain are formed and thus FinFET devices, that is, non-planar transistors are obtained. It should be easily realized by those skilled in the art that in some embodiments of the present invention, a selective epitaxial growth (hereinafter abbreviated as SEG) and/or salicide process can be integrated in the FinFET fabrication processing, and those details are omitted in the interest of brevity. Additionally, in those embodiments integrated with gate-last process, the gate patterns 230 and the dummy gate patterns 232 can be removed after forming the abovementioned elements and replaced with the required metal gates.

Figure 4:
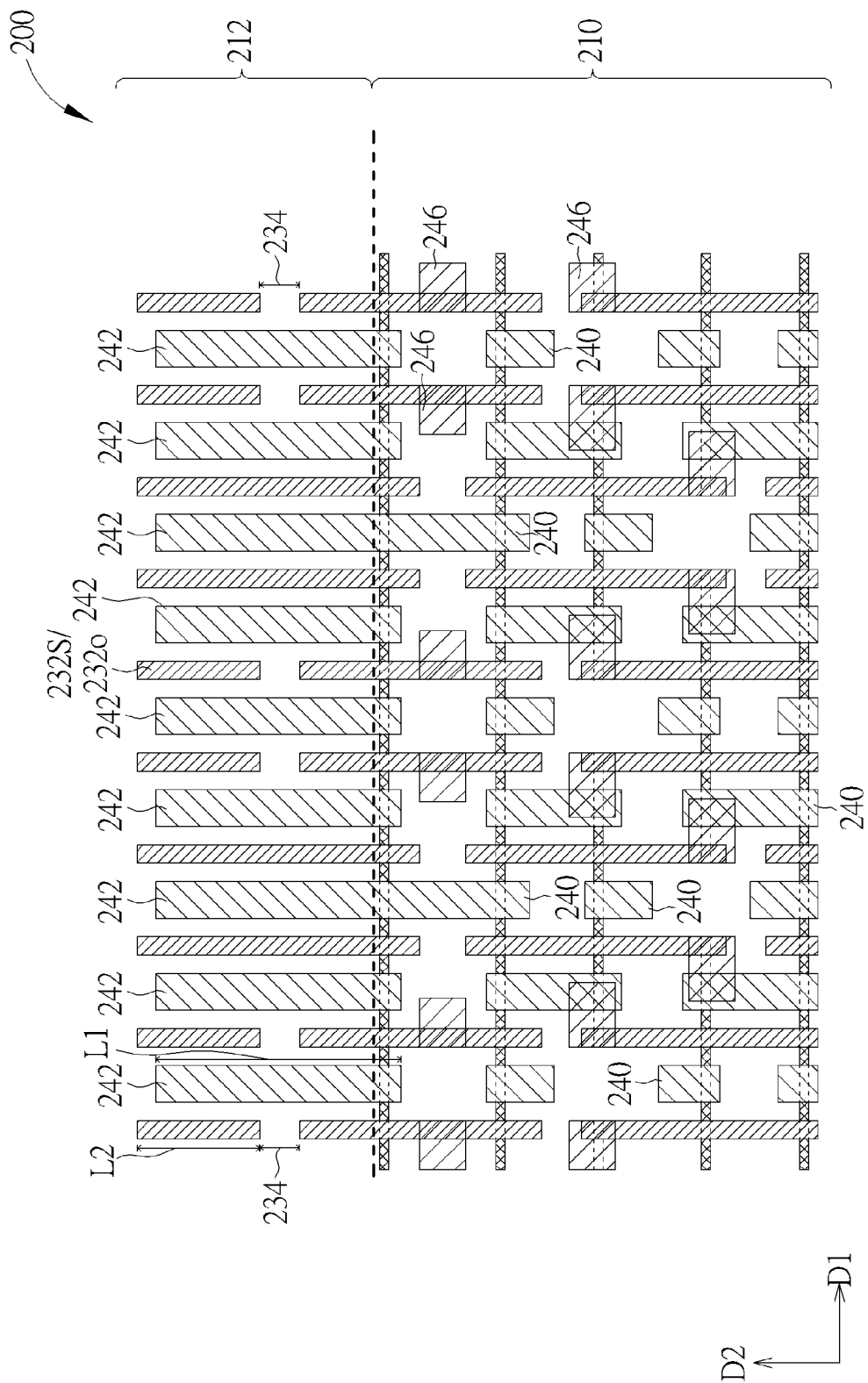

Please refer to FIG. 4. Next, an inter-layer dielectric (hereinafter abbreviated as ILD) layer (not shown) is formed on the substrate 200 and followed by forming a plurality of contact openings (not shown) in the ILD layer. Then, those contact openings are filled up with conductive materials, and thus a plurality of contact patterns 240 and a plurality of dummy contact patterns 242 are formed in the ILD layer. As shown in FIG. 4, the contact patterns 240 are disposed in the cell region and the cell edge region 210 and the dummy contact patterns 242 are disposed in the dummy region 212. The contact patterns 240 and the dummy contact patterns 242 are all extended along the second direction D2 and arranged along the first direction D1. As shown in FIG. 4, in the cell edge region 210, the contact patterns 240 and the gate patterns 230 are alternately arranged along the first direction D1. Also, in the dummy region 212, the dummy contact patterns 242 and the dummy gate patterns 232 are alternately arranged along the first direction D1. A length $L_1$ of the dummy contact patterns 242 is larger than a length $L_2$ of the outer dummy gate 232o of the sectioned dummy gate pairs 232S. It is noteworthy that in some embodiments of the present invention, the contact patterns 240 and the dummy contact patterns 242 are the lowest layer (the layer nearest to the substrate 200 and the FinFET devices) of an interconnection structure. And thus the contact patterns 240 and the dummy contact patterns 242 may be taken as the zeroth metal layer M0 of the given interconnection structure.

Please still refer to FIG. 4. Additionally, a plurality of contacts patterns 246 are formed in the cell region and the cell edge region 210. The contact patterns 246 are formed to overlap the gate patterns 230 as shown in FIG. 4. Consequently, the gate patterns 230 are physically and electrically connected to the contact patterns 246. Furthermore, some of the contact patterns 246 overlap the contact patterns 240 as shown FIG. 4.

Figure 5:
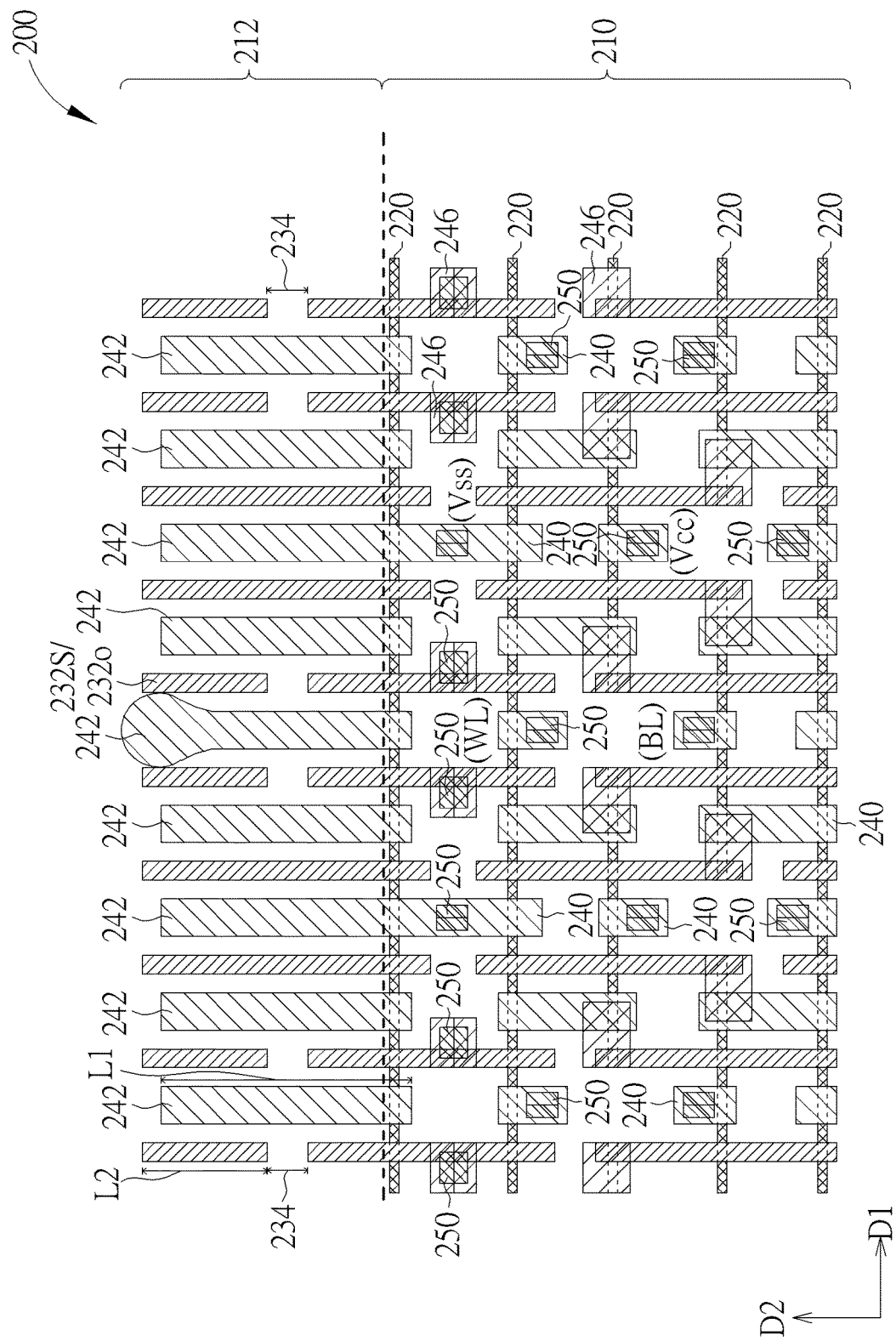

Please refer to FIG. 5. After forming the contact patterns 240/246 and the dummy contact patterns 242, another dielectric layer (not shown) is formed on the ILD layer and followed by forming a plurality of via openings (not shown) in the dielectric layer. Next, the via openings are filled with conductive materials and thus a plurality of via patterns 250 are obtained as shown in FIG. 5. The via patterns 250 can be formed by single patterning process, and the single patterning process may include an immersion DUV lithography or E-beam lithography, but not limited to this. Alternatively, the via patterns 250 can be formed by the aforementioned multiple patterning process. As shown in FIG. 5, the via patterns 250 overlap the contact patterns 240/246. And the overlapped via patterns 250 and contact patterns 240/246 are electrically connected. In the preferred embodiment, the via patterns 250 are provided to construct electrical connections between the contact patterns 240/246 and other wires/lines. Therefore, the via patterns 250 are taken as the zeroth via plugs V0 of the given interconnection structure.

Please still refer to FIG. 5. As mentioned above, the via patterns 250 are provide to construct electrical connections between the contact patterns 240 and other wires/lines. For example, one of the contact patterns 240/246 is electrically connected to a word line (WL) by the via pattern 250, another one of the contact patterns 240 is electrically connected to Vss by the via pattern 250, another one of the contact patterns 240 is electrically connected to a bit line (BL) by the via pattern 250, and still another one of the contact patterns 240 is electrically connected to Vcc by the via pattern 250, as shown in FIG. 5.

As mentioned above, due to line-end effect and pattern density effect, the line end of the dummy contact patterns 242 may be spontaneously enlarged during fabrication processing because they are near iso area. And such effect is even worse after OPC. Consequently, the enlargements of the dummy contact patterns 242 make the dummy gate patterns 232, specifically the outer dummy gate 232o of the dummy gate patterns 232, and the dummy contact patterns 242 contact each other as depicted in FIG. 5, and thus a short circuit may be formed. However, as shown in FIG. 5, since the outer dummy gate 232o is spaced apart from the inner dummy gate 232i by the gap 234, the short circuit is cut off.

According to the semiconductor layout structure provided by the first preferred embodiment, the pattern enlargement due to pattern density effect, line-end effect, and/or OPC is no longer a threat to the devices formed in the cell edge region 210 due to the gap 234 formed to section the dummy gate patterns 232 and to isolate the contact outer dummy gate 232o and dummy contact pattern 242 from the inner dummy gate 232i in the dummy region 212 and the gate pattern 230 in the cell edge region 210. Briefly speaking, no impact will be introduced into the circuit devices formed in the cell edge region 210 even though the contact between the outer dummy gate 232o and the dummy contact pattern 242 occurs.

Figure 6:
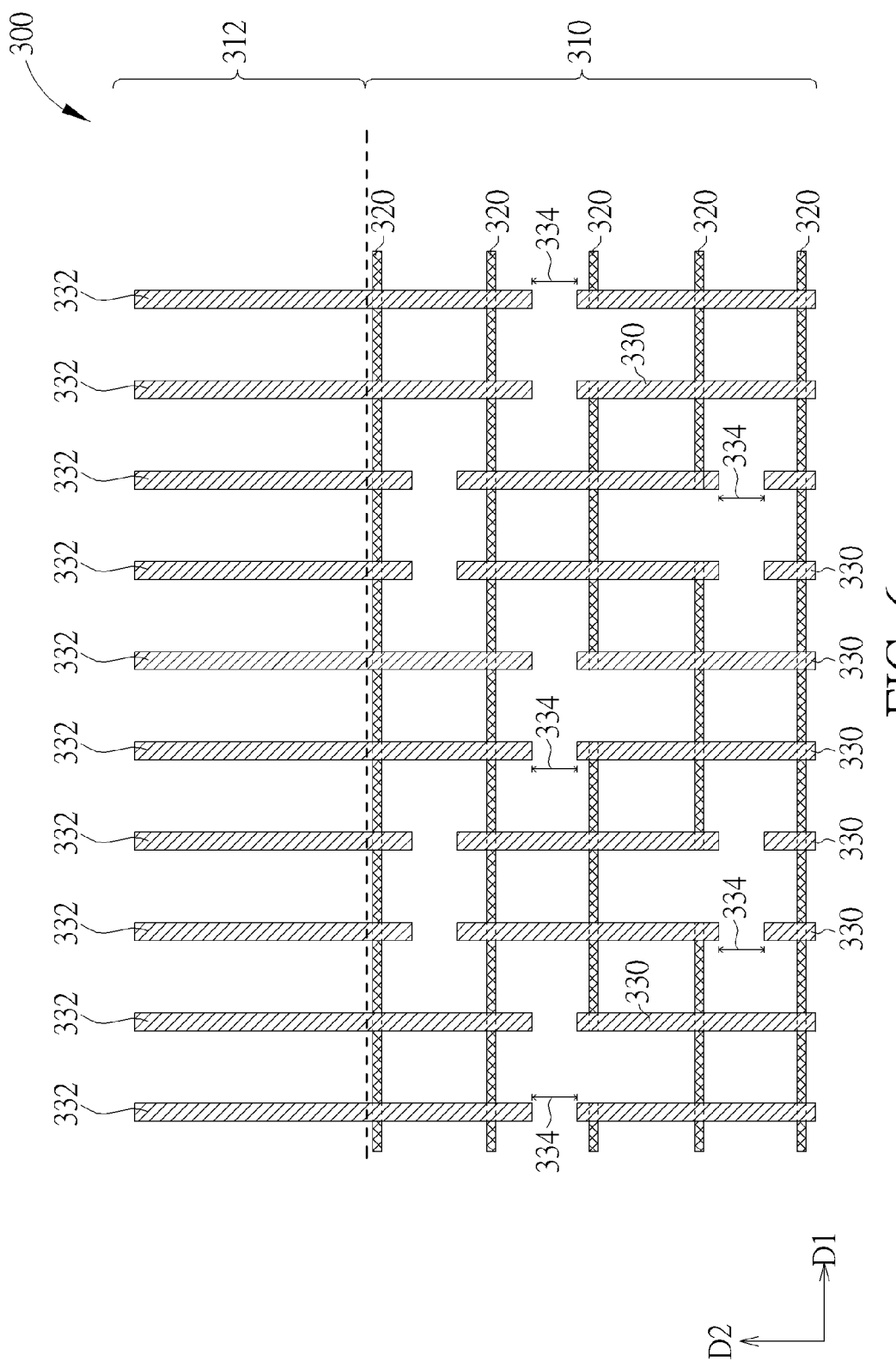

Please refer to FIGS. 6-10, which are schematic drawing illustrating steps for forming a semiconductor layout structure provided by a second preferred embodiment of the present invention. It should be noted that elements the same in the first and second preferred embodiments can include the same material, thus those details are omitted in the interest of brevity. Please refer to FIG. 6. According to the preferred embodiment, a substrate 300 is provided. The substrate 300 includes a cell region (not shown) and a dummy region 312 defined thereon. A portion of the cell region which is abutting to the dummy region 312 is referred to a cell edge region 310, and FIG. 6 shows a portion of the substrate 300 near the boundary of the cell edge region 310 and the dummy region 312.

Next, a patterned hard mask (not shown) is formed on the substrate 300 to define placement and size of a plurality of fins for non-planar FET devices. As mentioned above, when a fin pitch of the fins to be formed is beyond the capability of current single exposure lithography system and technology, the multiple patterning process, such as a double patterning process can be used to form the patterned hard mask defining the placement and the size for the fins. In some embodiments of the present invention, the double patterning process such as, for example but not limited to, SADP process is used to form the fins. Consequently, a plurality of fin patterns 320 are formed in the cell region and the cell edge region 310. As shown in FIG. 6, the fin patterns 320 are all extended along a first direction D1 and arranged along a second direction D2, and the first direction D1 and the second direction D2 are perpendicular to each other.

Please refer to FIG. 6. After forming the fin patterns 320, the patterned hard mask can be removed or left on the substrate 300 depending on different product and/or process requirements. Thereafter, a plurality of patterns 330/332 are formed on the substrate 300. The patterns 320 can be formed by single or multiple patterning process depending on different product and/or process requirements, and those details are omitted herein in the interest of brevity. As shown in FIG. 6, the patterns 330/332 are extended along the second direction D2 and arranged along the first direction D1. Please note that the patterns disposed in the cell region and the cell edge region 310 are defined as gate patterns 330 while the patterns disposed in the dummy region 312 are defined as dummy gate patterns 332 though the gate patterns 330 and the dummy gate patterns 332 may contact each other at the boundary of the cell edge region 310 and the dummy region 312, and thus to form continuous structures, respectively, as shown in FIG. 6. Furthermore, the gate patterns 330 cross the fin patterns 320 and thus overlap a portion of the fin patterns 320. The gate patterns 330 and dummy gate patterns 332 respectively include a gate dielectric layer (not shown) and a gate conductive layer (not shown).

Please still refer to FIG. 6. After forming the gate patterns 330 and the dummy gate patterns 332, a plurality of gap 334 are formed to section the gate patterns 330 in the cell region and the cell edge region 310. It is noteworthy that in the preferred embodiment, the dummy gate patterns 332 are protected from the sectioning. Consequently, no gaps are formed in the dummy gate patterns 332 in the dummy region 312.

After forming the gate patterns 330 and the dummy gate patterns 332, elements such as source/drain extension regions, spacers, and source/drain are formed and thus FinFET devices, that is, non-planar transistors are obtained. It should be easily realized by those skilled in the art that in some embodiments of the present invention, a SEG and/or salicide process can be integrated in the FinFET fabrication processing, and those details are omitted in the interest of brevity. Additionally, in those embodiments integrated with gate-last process, the gate patterns 330 and the dummy gate pattern 332 can be removed after forming the abovementioned elements and replaced with the required metal gates.

Figure 7:
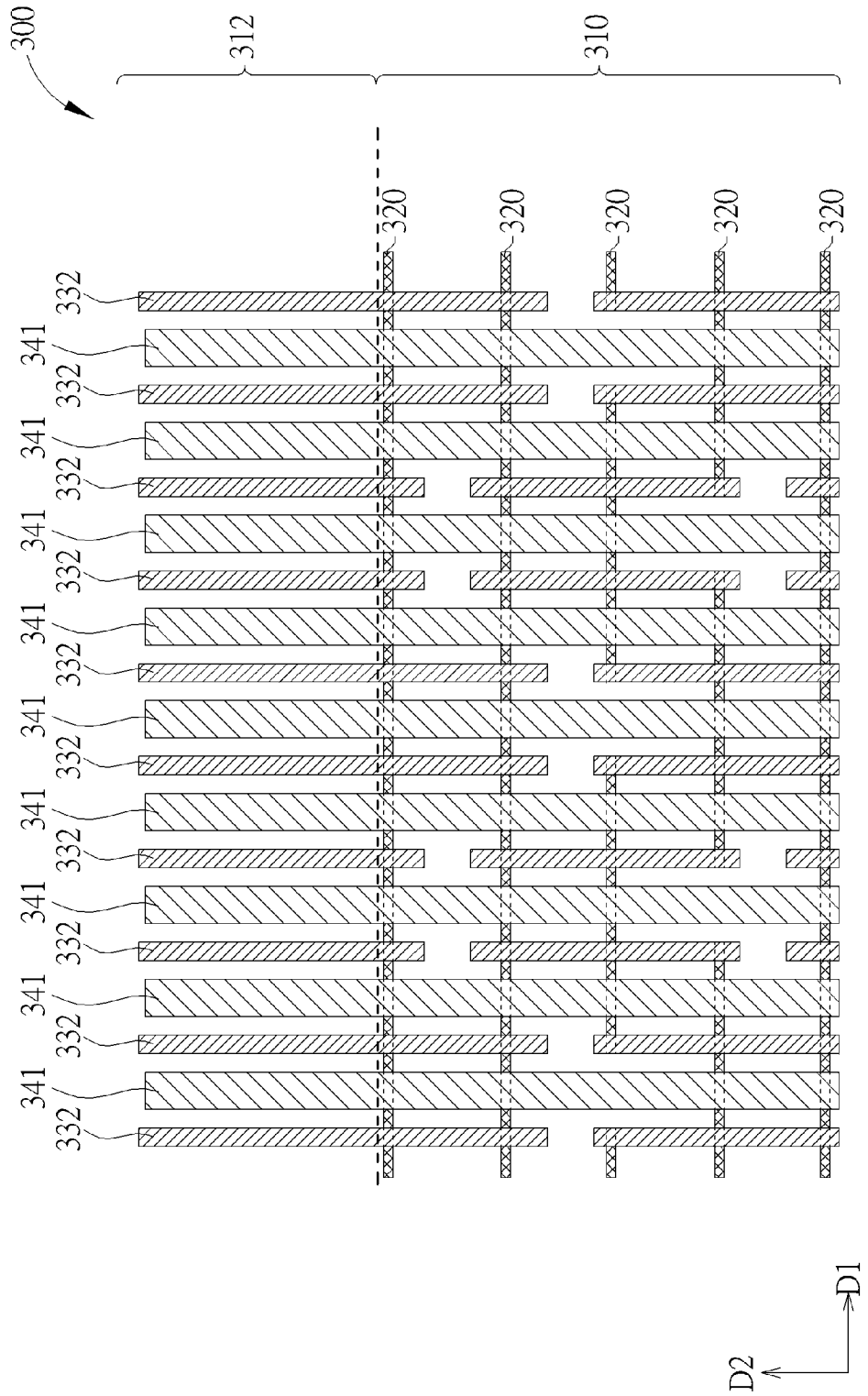
Figure 8:
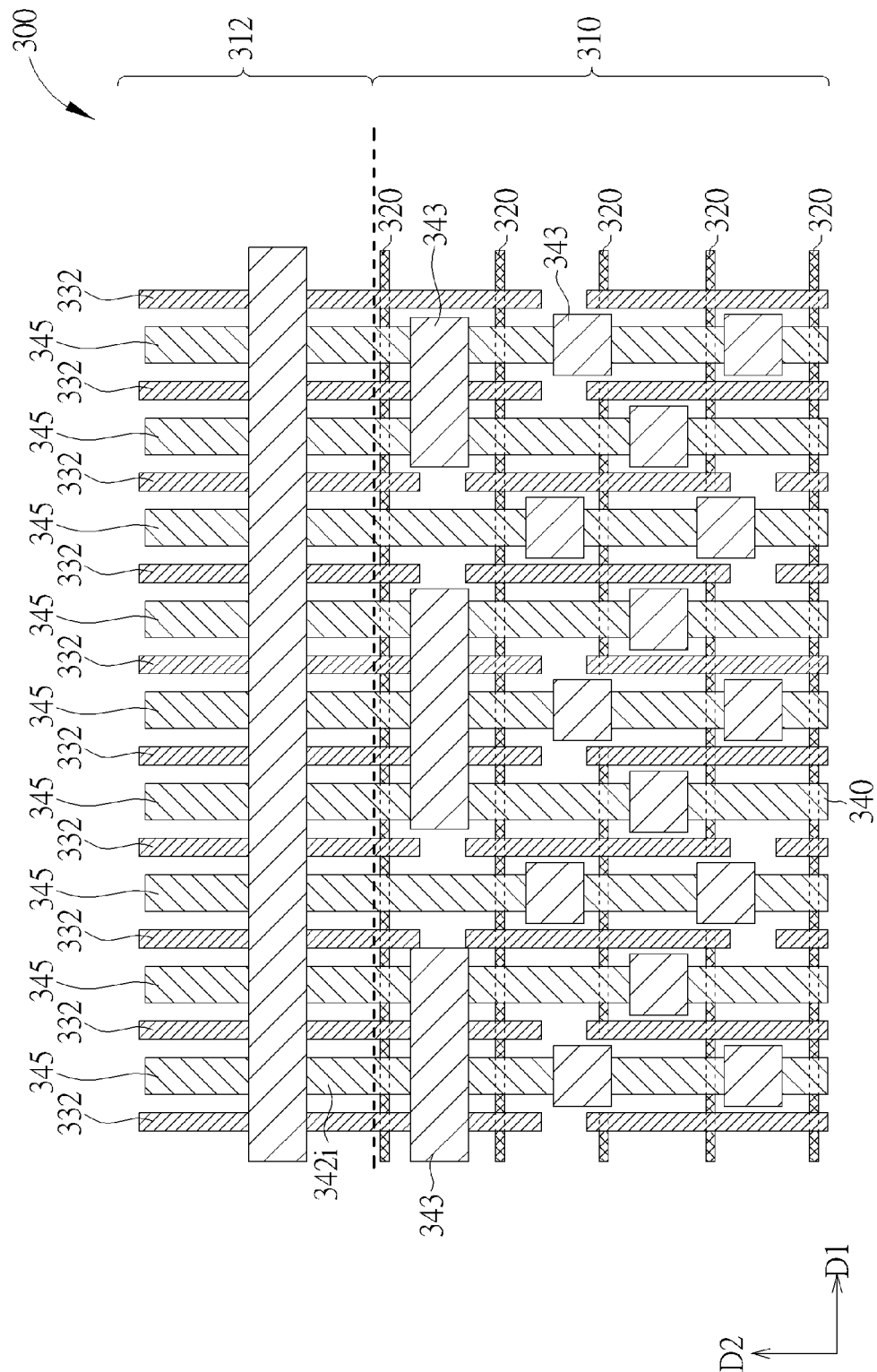

Please refer to FIGS. 7 and 8. Next, an ILD layer (not shown) is formed on the substrate 300 and followed by forming a plurality of contact pre-opening patterns 341 on the ILD layer. As shown in FIG. 7, the pre-opening patterns 341 are patterns extended along the second direction D2 and arranged along the first direction D1. Next, a plurality of cutting patterns 343 are formed on the pre-opening patterns 341. It is noteworthy that the cutting patterns 343 cut the pre-opening patterns 341 into sections and thus a plurality of contact opening patterns 345 are obtained as shown in FIG. 8. Thereafter, an etching process is performed to etch the ILD layer and thus the contact opening patterns 345 are transferred to the ILD layer. In some embodiments of the present invention, the pre-opening patterns 341 can be formed after the cutting patterns 343, so that the pre-opening patterns 341 are spontaneously cut and the contact opening patterns 345 are obtained as shown in FIG. 8.

Figure 9:
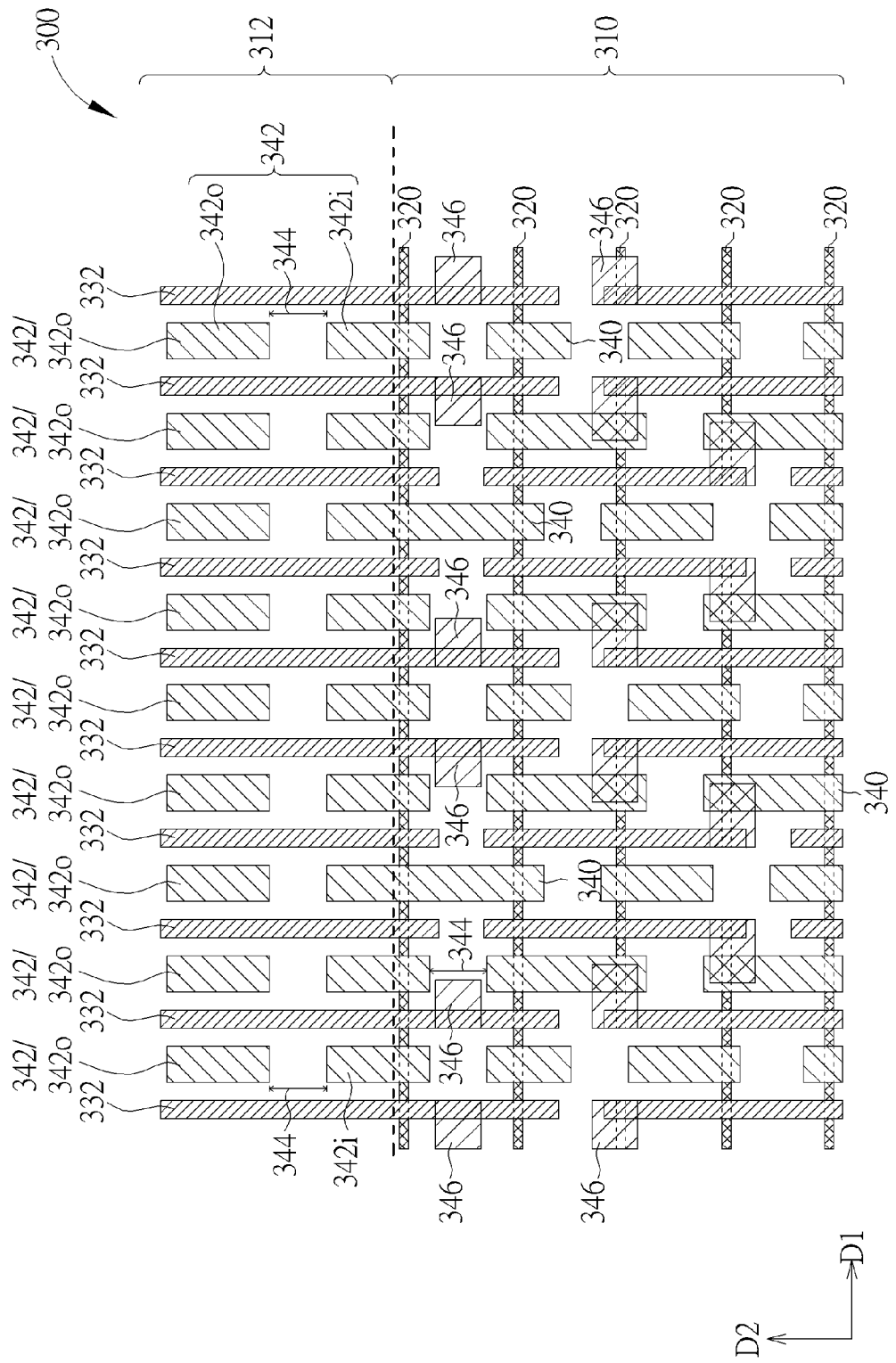

Please refer to FIG. 9. Then, those contact opening patterns 345 are filled up with conductive materials and thus, a plurality of contact patterns 340 and a plurality of dummy contact patterns 342 are formed in the ILD layer. As shown in FIG. 9, the contact patterns 340 are disposed in the cell region and the cell edge region 310 and the dummy contact patterns 342 are disposed in the dummy region 312. The contact patterns 340 and the dummy contact patterns 342 are all extended along the second direction D2 and arranged along the first direction D1. In the cell edge region 310, the contact patterns 340 and the gate patterns 330 are alternately arranged along the first direction D1. And in the dummy region 312, the dummy contact patterns 342 and the dummy gate patterns 332 are alternately arranged along the first direction D1. It is noteworthy that in some embodiments of the present invention, the contact patterns 340 and the dummy contact patterns 342 are the lowest layer (the layer nearest to the substrate 300 and the FinFET device) of an interconnection structure. And thus the contact patterns 340 and the dummy contact patterns 342 may be taken as the zeroth metal layer M0 of the given interconnection structure.

Please still refer to FIG. 9. In the preferred embodiment, the dummy contact patterns 342 are respectively sectioned by gaps 344 and thus each dummy contact pattern 342 includes an inner dummy contact 342i and an outer dummy contact 342o arranged along the second direction D2. The inner dummy contact 342i and the outer dummy contact 342o in the dummy region 312 are spaced apart from each other by the gap 344 while the contact patterns 340 in the cell region and cell edge region 310 are spaced apart from each other also by the gap 344. And a width of the gaps 344 between the inner dummy contact 342i and the outer dummy contact 342o is equal to a width of the gaps 344 between the contact patterns 340, but not limited to this. As shown in FIG. 9, the inner dummy contact 342i is proximal to the cell edge region 310 and the outer dummy contact 342o is distal to the cell edge region 310. In other words, the inner dummy contact 342i is always between the cell edge region 310 and the outer dummy contact 342o. Also as shown in FIG. 9, the contact patterns 340 nearest to the dummy region 312 contact the inner dummy contact 342i, respectively. It is noteworthy that a sum of a length of the outer dummy contact 342o and a length of the inner dummy contact 342i is smaller than a length of the dummy gate patterns 332.

Please still refer to FIG. 9. Additionally, a plurality of contacts patterns 346 are formed in the cell region and the cell edge region 310. The contact patterns 346 are formed to overlap the gate patterns 340 as shown in FIG. 9. Consequently, the gate patterns 340 are physically and electrically connected to the contact patterns 346. Furthermore, some of the contact patterns 346 even overlap the contact patterns 340.

Figure 10:
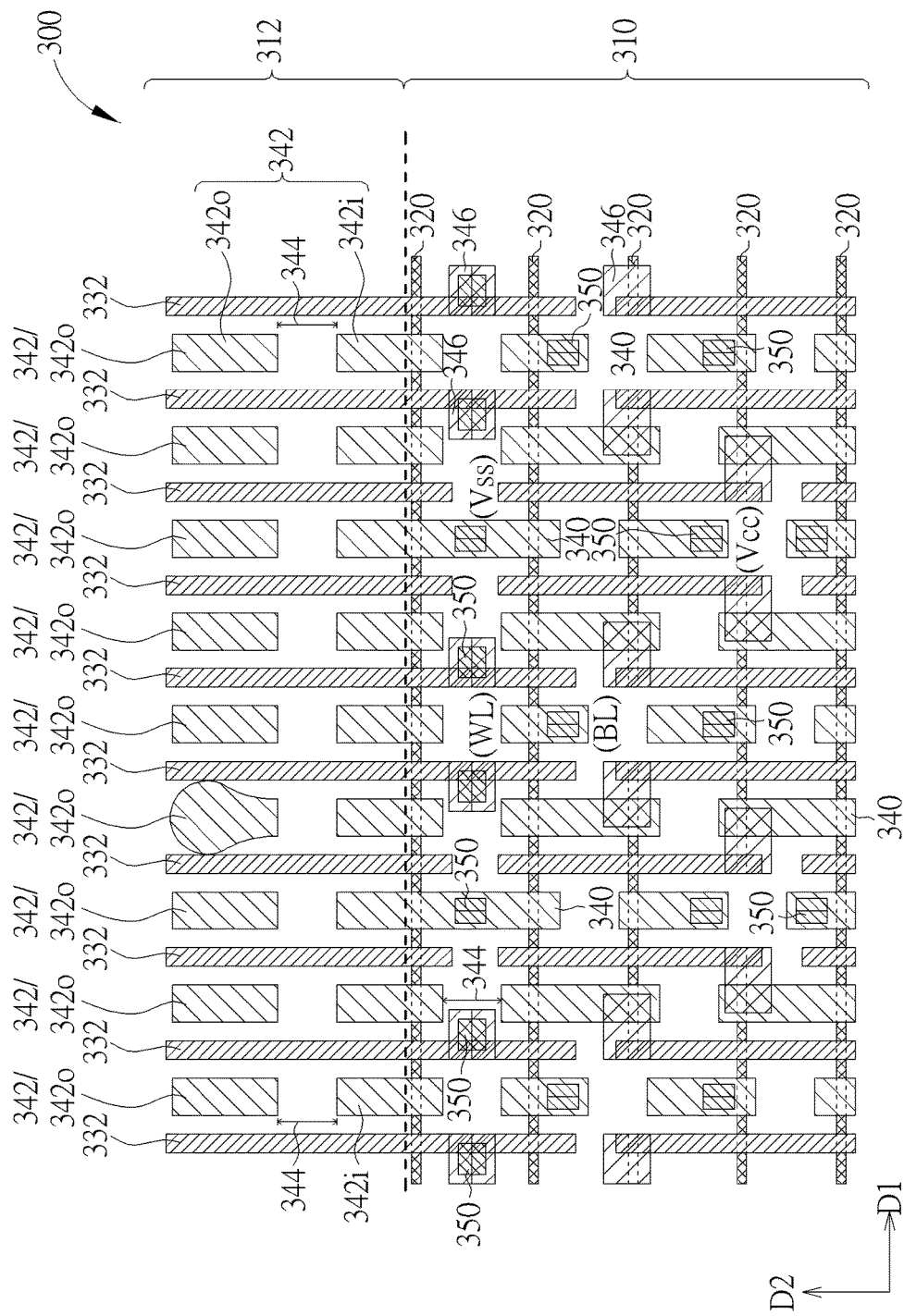

Please refer to FIG. 10. After forming the contact patterns 340/346 and the dummy contact patterns 342, another dielectric layer (not shown) is formed on the ILD layer and followed by forming a plurality of via openings (not shown) in the dielectric layer. Next, the via openings are filled with conductive materials and thus a plurality of via patterns 350 are obtained as shown in FIG. 10. The via patterns 350 can be formed by single patterning process, and the single patterning process may include an immersion DUV lithography or E-beam lithography, but not limited to this. Alternatively, the via patterns 350 can be formed by the aforementioned multiple patterning process. As shown in FIG. 10, the via patterns 350 overlap the contact patterns 340/346. And the overlapped via patterns 350 and contact patterns 340/346 are electrically connected. In the preferred embodiment, the via patterns 350 are provided to construct electrical connections between the contact patterns 340/346 and other wires/lines. Therefore, the via patterns 350 are taken as the zeroth via plugs V0 of the given interconnection structure.

Please still refer to FIG. 10. As mentioned above, the via patterns 350 are provide to construct electrical connections between the contact patterns 340/346 and other wires/lines. For example, one of the contact patterns 340/346 is electrically connected to a word line (WL) by the via pattern 350, another one of the contact patterns 340 is electrically connected to Vss by the via pattern 350, another one of the contact patterns 340 is electrically connected to a bit line (BL) by the via pattern 350, and still another one of the contact patterns 340 is electrically connected to Vcc by the via pattern 350, as shown in FIG. 10.

As mentioned above, due to line-end effect and pattern density effect, the line end of the dummy contact patterns 342, specifically the outer dummy contact 342O of the dummy contact patterns 342, may be spontaneously enlarged during fabrication processing because they are near iso area. And such effect is even worse after OPC. Consequently, the enlargements of the dummy contact patterns 342 make the dummy gate patterns 332 and the dummy contact patterns 342, specifically the outer dummy contact 342o, contact each other as depicted in FIG. 10, and thus a short circuit may be formed. However, as shown in FIG. 10, since the outer dummy contact 342o is spaced apart from the inner dummy contact 342i by the gap 344, the short circuit is cut off.

According to the semiconductor layout structure provided by the second preferred embodiment, the pattern enlargement due to pattern density effect, line-end effect, and/or OPC is no longer a threat to the devices formed in the cell edge region 310 due to the gap 344 formed to section the dummy contact patterns 342 and to isolate the contact outer dummy contact 342o and dummy gate pattern 332 from the inner dummy contact 342i in the dummy region 312 and the gate pattern 330 in the cell edge region 310. Briefly speaking, no impact will be introduced into the circuit devices formed in the cell edge region 310 even though the contact between the outer dummy 342o and the dummy gate patterns 332 occurs.

Figure 11:
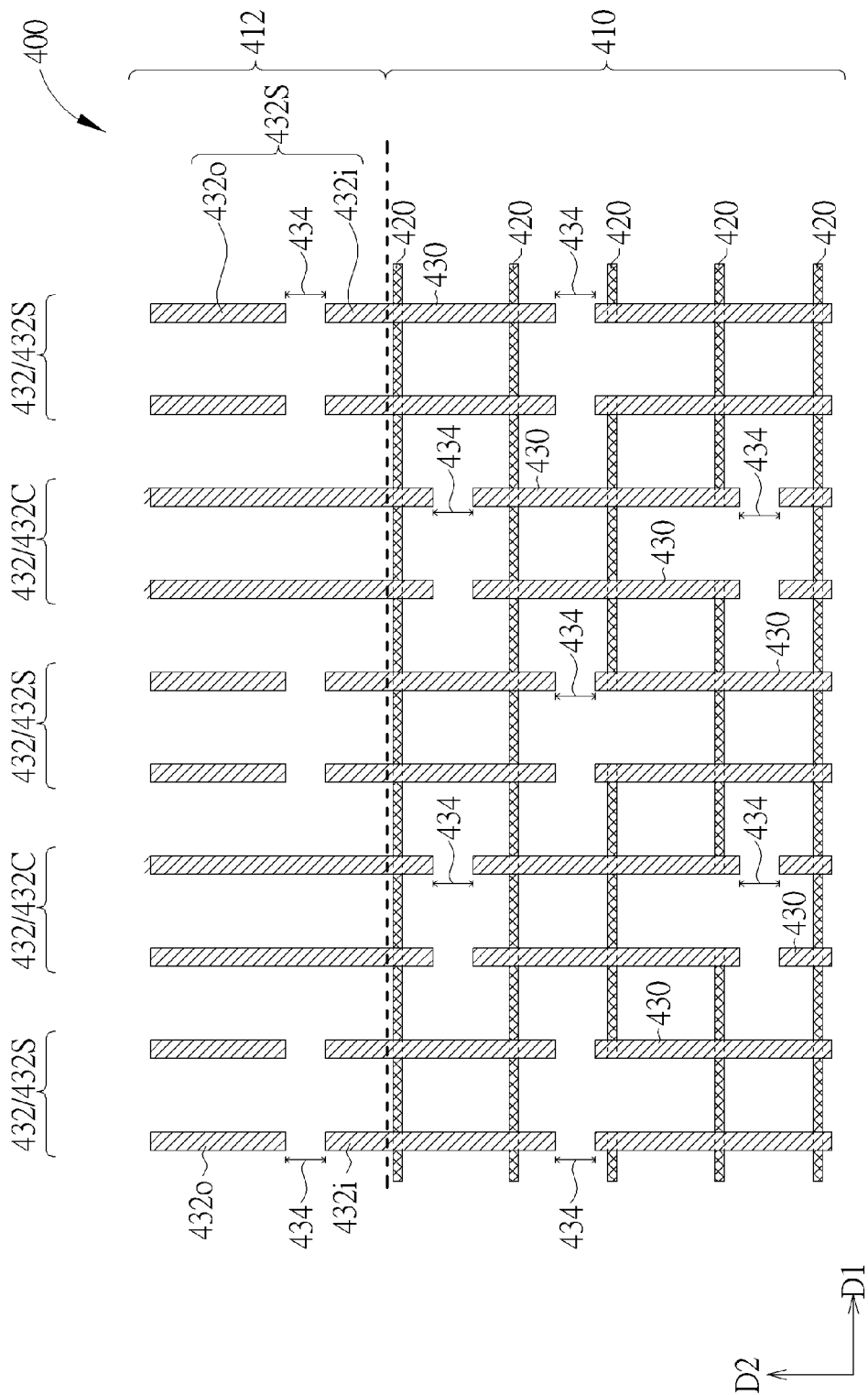

Please refer to FIGS. 11-15, which are schematic drawing illustrating steps for forming a semiconductor layout structure provided by a third preferred embodiment of the present invention. It should be noted that elements the same in the first/second and the third preferred embodiments can include the same material, thus those details are omitted in the interest of brevity. Please refer to FIG. 11. According to the preferred embodiment, a substrate 400 is provided. The substrate 400 includes a cell region (not shown) and a dummy region 412 defined thereon. A portion of the cell region which is abutting to the dummy region 412 is referred to a cell edge region 410, and FIG. 11 shows a portion of the substrate 400 near the boundary of the cell edge region 410 and the dummy region 412.

Next, a patterned hard mask (not shown) is formed on the substrate 400 to define placement and size of a plurality of fins for non-planar FET devices. In some embodiments of the present invention, a fin pitch of the fins to be formed is beyond the capability of current single exposure lithography system and technology, and thus the multiple patterning process, such as a double patterning process can be used to form the patterned hard mask defining the placement and the size for the fins. In some embodiments of the present invention, the double patterning process such as, for example but not limited to, SADP process is used to form the fins. Consequently, a plurality of fin patterns 420 are formed in the cell region and the cell edge region 410. As shown in FIG. 11, the fin patterns 420 are all extended along a first direction D1 and arranged along a second direction D2, and the first direction D1 and the second direction D2 are perpendicular to each other.

Please refer to FIG. 11. After forming the fin patterns 420, the patterned hard mask can be removed or left on the substrate 400 depending on different product and/or process requirements. Thereafter, a plurality of patterns 430/432 are formed on the substrate 400. The patterns 430/432 can be formed by single or multiple patterning process depending on different product and/or process requirements, and those details are omitted herein in the interest of brevity. As shown in FIG. 11, the patterns 430/432 are extended along the second direction D2 and arranged along the first direction D1. Please note that the patterns disposed in the cell region and the cell edge region 410 are defined as gate patterns 430 while the patterns disposed in the dummy region 412 are defined as dummy gate patterns 432 though the gate patterns 430 and the dummy gate patterns 432 may contact each other at the boundary of the cell edge region 410 and the dummy region 412, and thus to form continuous structures, respectively, as shown in FIG. 11. Furthermore, the gate patterns 430 cross the fin patterns 420 and thus overlap a portion of the fin patterns 420. The gate patterns 430 and dummy gate patterns 432 respectively include a gate dielectric layer (not shown) and a gate conductive layer (not shown).

Please still refer to FIG. 11. After forming the gate patterns 430 and the dummy gate patterns 432, a plurality of gaps 434 are formed to section the gate patterns 430 and the dummy gate patterns 432. It is noteworthy that in the dummy region 412, some dummy gate patterns 432 are sectioned while the others are not. Consequently, a plurality of sectioned dummy gate pairs 432S and a plurality of continuous dummy gate pairs 432C are obtained. More important, the sectioned dummy gate pairs 432S and the continuous dummy gate pairs 432C are alternately arranged pair by pair as shown in FIG. 11. Furthermore, in each sectioned dummy gate pair 432S, the dummy gate patterns 432 are sectioned to form an inner dummy gate 432i and an outer dummy gate 432o arranged along the second direction D2. As shown in FIG. 11, the inner dummy gate 432i is proximal to the cell edge region 410 while the outer dummy gate 432o is distal to the cell edge region 410. In other words, in each sectioned dummy gate pair 432S, the inner dummy gate 432i is always disposed in between the cell edge region 410 and the outer dummy gate 432o. Furthermore, the inner dummy gate 432i contacts the gate pattern 430 in the cell edge region 410, respectively. As shown in FIG. 11, the gate patterns 430 in the cell region and the cell edge region 410 are spaced apart from each other by the gaps 434. And a width of the gaps 434 between the gate patterns 432 is equal to a width of the gaps 434 between the inner dummy gate 432i and the outer dummy gate 432o.

After forming the gate patterns 430 and the dummy gate patterns 432, elements such as source/drain extension regions, spacers, and source/drain are formed and thus FinFET devices, that is, non-planar transistors are obtained. It should be easily realized by those skilled in the art that in some embodiments of the present invention, a SEG and/or salicide process can be integrated in the FinFET fabrication processing, and those details are omitted in the interest of brevity. Additionally, in those embodiments integrated with gate-last process, the gate patterns 430 and the dummy gate patterns 432 can be removed after forming the abovementioned elements and replaced with the required metal gates.

Figure 12:
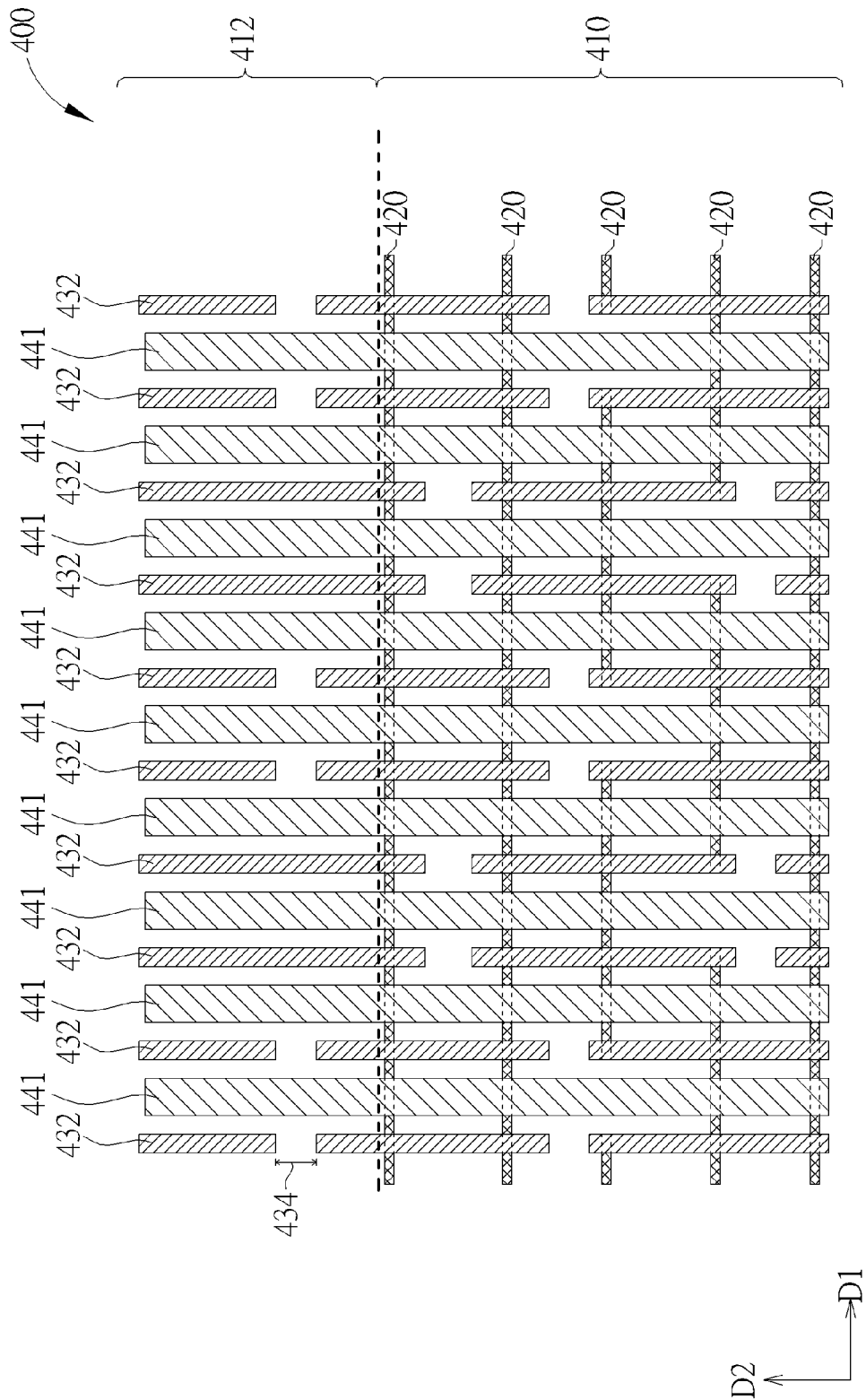
Figure 13:
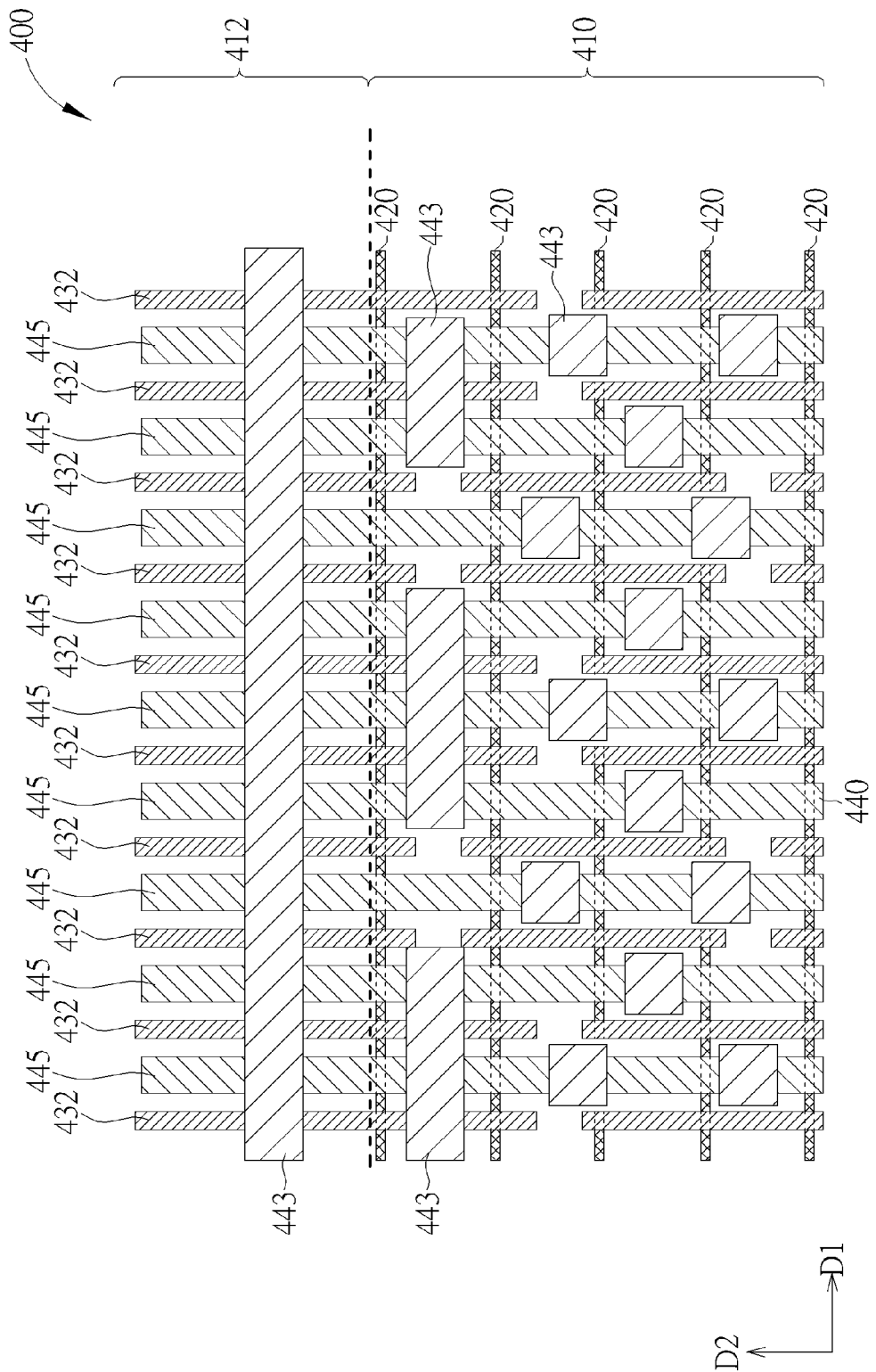

Please refer to FIGS. 12 and 13. Next, an ILD layer (not shown) is formed on the substrate 400 and followed by forming a plurality of contact pre-opening patterns 441 on the ILD layer. As shown in FIG. 12, the pre-opening patterns 441 are patterns extended along the second direction D2 and arranged along the first direction D1. Next, a plurality of cutting patterns 443 are formed on the pre-opening patterns 441. It is noteworthy that the cutting patterns 443 cut the pre-opening patterns 441 into sections and thus a plurality of contact opening patterns 445 are obtained as shown in FIG. 13. Thereafter, an etching process is performed to etch the ILD layer and thus the contact opening patterns 445 are transferred to the ILD layer. In some embodiments of the present invention, the pre-opening patterns 441 can be formed after the cutting patterns 443, so that the pre-opening patterns 441 are spontaneously cut and the contact opening patterns 445 are obtained as shown in FIG. 13.

Figure 14:
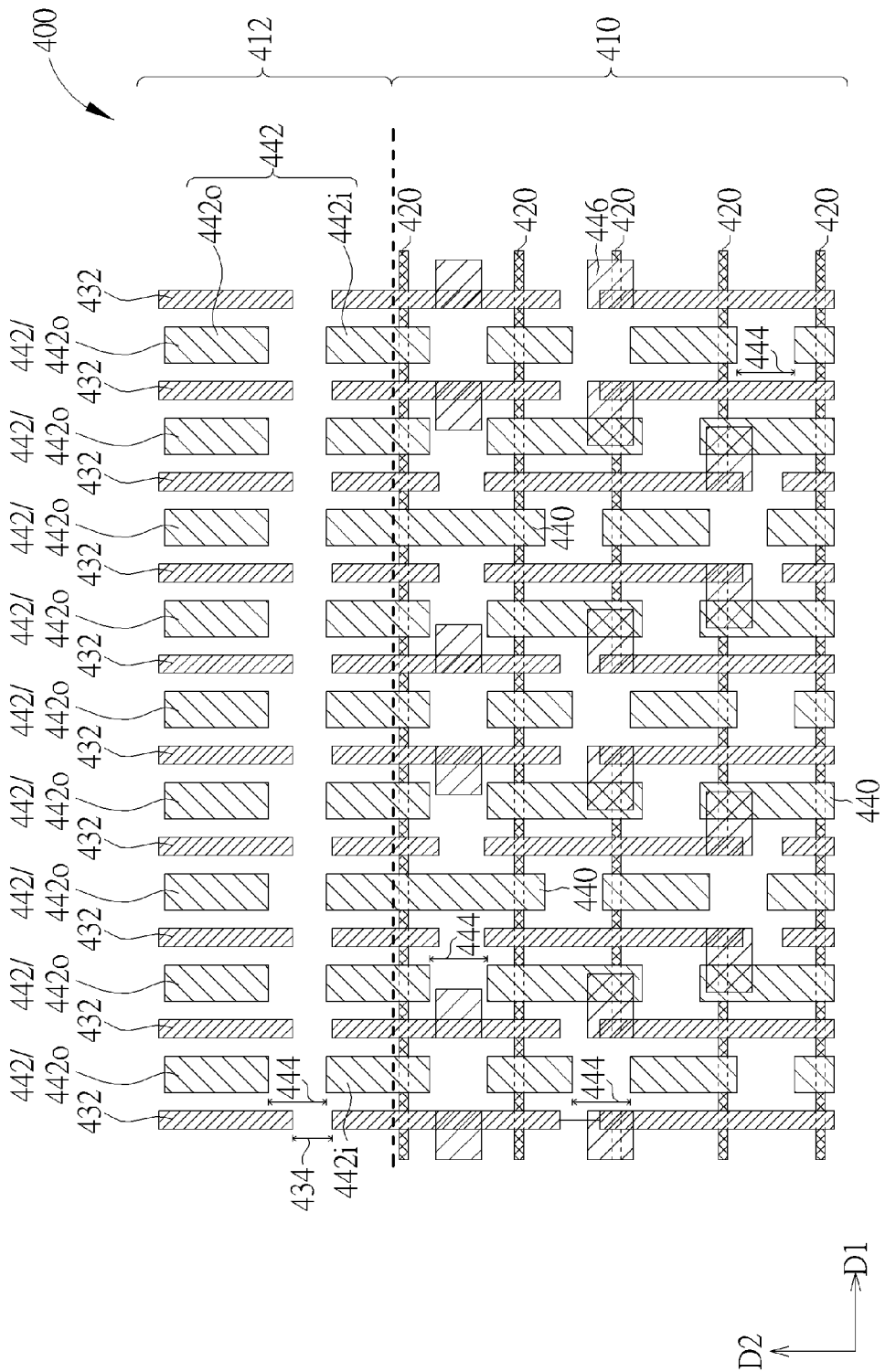

Please refer to FIG. 14. Then, those contact opening patterns 445 are filled up with conductive materials and thus, a plurality of contact patterns 440 and a plurality of dummy contact patterns 442 are formed in the ILD layer. As shown in FIG. 14, the contact patterns 440 are disposed in the cell region and the cell edge region 410 and the dummy contact patterns 442 are disposed in the dummy region 412. The contact patterns 440 and the dummy contact patterns 442 are all extended along the second direction D2 and arranged along the first direction D1. It is noteworthy that in some embodiments of the present invention, the contact patterns 440 and the dummy contact patterns 442 are the lowest layer (the layer nearest to the substrate 400 and the FinFET device) of an interconnection structure. And thus the contact patterns 440 and the dummy contact patterns 442 may be taken as the zeroth metal layer M0 of the given interconnection structure. Furthermore, the dummy contact patterns 442 and the dummy gate patterns 432 are alternately arranged along the first direction D1 in the dummy region 410 while the contact patterns 440 and the gate patterns 430 are alternately arranged along the first direction D1 in the cell region and the cell edge region 410.

Please still refer to FIG. 14. In the preferred embodiment, the dummy contact patterns 442 are sectioned by gaps 444 and thus each dummy contact pattern 442 includes an inner dummy contact 442i and an outer dummy contact 442o arranged along the second direction D2. The inner dummy contact 442i and the outer dummy contact 442o in the dummy region 412 are spaced apart from each other by the gap 444 while the contact patterns 440 in the cell region and the cell edge region 410 are spaced apart from each other also by the gap 444. And a width of the gaps 444 between the inner dummy contact 442i and the outer dummy contact 442o is equal to a width of the gaps 444 between the contact patterns 440, but not limited to this. As shown in FIG. 14, the inner dummy contact 442i is proximal to the cell edge region 410 and the outer dummy contact 442o is distal to the cell edge region 410. In other words, the inner dummy contact 442i is always between the cell edge region 410 and the outer dummy contact 442o. Also as shown in FIG. 14, the contact patterns 440 nearest to the dummy region 412 contact the inner dummy contact 442i, respectively. Furthermore, a length of the outer dummy contact 442o of the dummy contact patterns 442 is smaller than a length of the outer dummy gate 432o of the dummy gate patterns 432.

Please still refer to FIG. 14. Additionally, a plurality of contacts patterns 446 are formed in the cell region and the cell edge region 410. The contact patterns 446 are formed to overlap the gate patterns 440 as shown in FIG. 14. Consequently, the gate patterns 440 are physically and electrically connected to the contact patterns 446. Furthermore, some of the contact patterns 446 even overlap the contact patterns 440.

Figure 15:
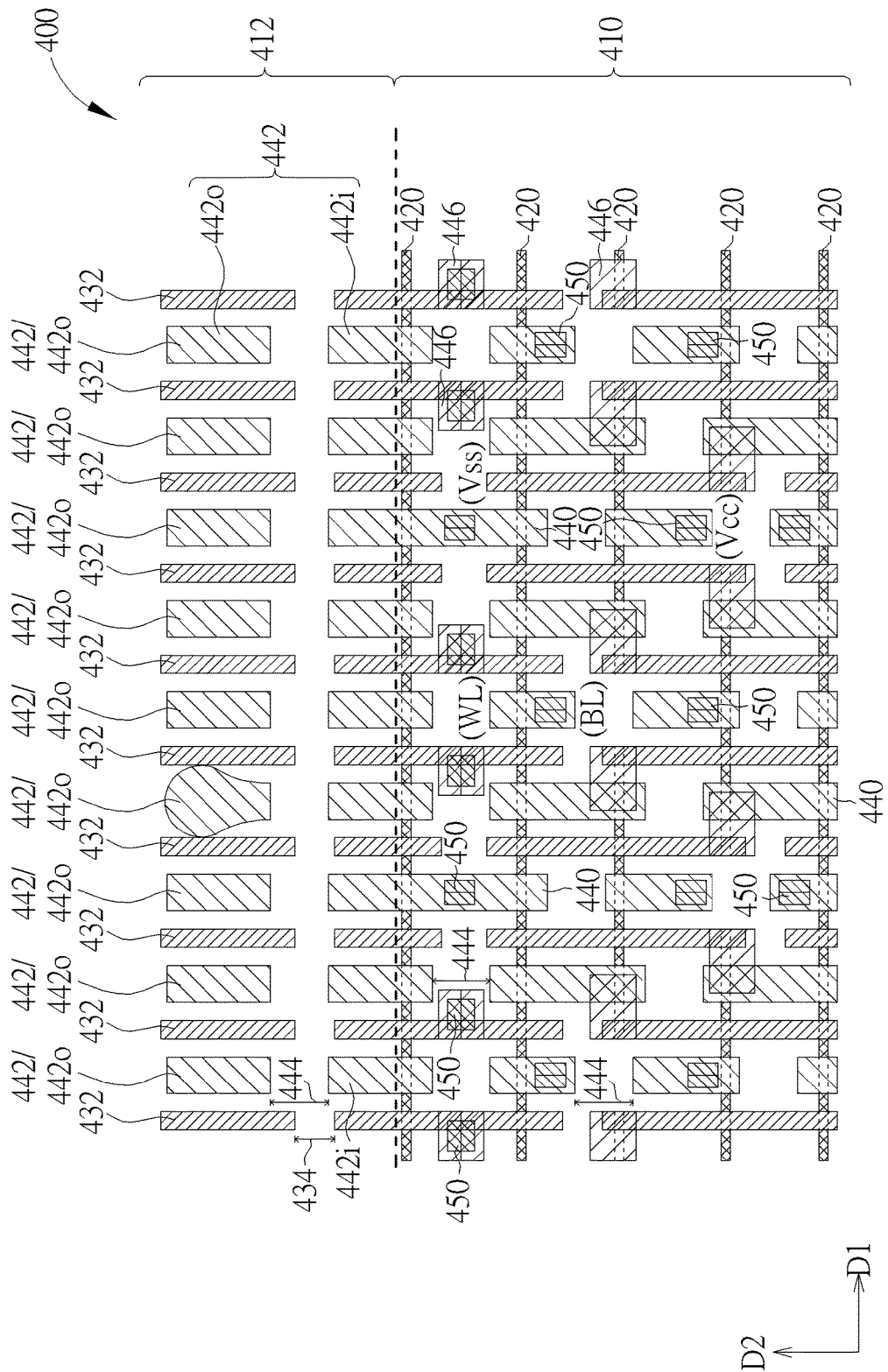

Please refer to FIG. 15. After forming the contact patterns 440/446 and the dummy contact patterns 442, another dielectric layer (not shown) is formed on the ILD layer and followed by forming a plurality of via openings (not shown) in the dielectric layer. Next, the via openings are filled with conductive materials and thus a plurality of via patterns 450 are obtained as shown in FIG. 15. The via patterns 450 can be formed by single patterning process, and the single patterning process may include an immersion DUV lithography or E-beam lithography, but not limited to this. Alternatively, the via patterns 450 can be formed by the aforementioned multiple patterning process. As shown in FIG. 15, the via patterns 450 overlap the contact patterns 440/446. And the overlapped via patterns 450 and contact patterns 440/446 are electrically connected. In the preferred embodiment, the via patterns 450 are provided to construct electrical connections between the contact patterns 440/446 and other wires/lines. Therefore, the via patterns 450 are taken as the zeroth via plugs V0 of the given interconnection structure.

Please still refer to FIG. 15. As mentioned above, the via patterns 450 are provide to construct electrical connections between the contact patterns 440/446 and other wires/lines. For example, one of the contact patterns 440/446 is electrically connected to a word line (WL) by the via pattern 450, another one of the contact patterns 440 is electrically connected to Vss by the via pattern 450, another one of the contact patterns 440 is electrically connected to a bit line (BL) by the via pattern 450, and still another one of the contact patterns 440 is electrically connected to Vcc by the via pattern 450, as shown in FIG. 15.

As mentioned above, due to line-end effect and pattern density effect, the line end of the dummy contact patterns 442, specifically the outer dummy contact 442o, may be spontaneously enlarged during fabrication processing because they are near iso area. And such effect is even worse after OPC. Consequently, the enlargements of the dummy contact patterns 442 make the dummy gate patterns 432 and the dummy contact patterns 442, specifically the outer dummy gate 432o and the outer dummy contact 442o, contact each other as depicted in FIG. 15, and thus a short circuit may be formed. However, as shown in FIG. 15, since the outer dummy gate 432o is spaced apart from the inner dummy gate 432i by the gap 434, and the outer dummy contact 442o is spaced apart from the inner dummy contact 442i by the gap 444, the short circuit is cut off.

According to the semiconductor layout structure provided by the third preferred embodiment, the pattern enlargement due to pattern density effect, line-end effect, and/or OPC is no longer a threat to the devices formed in the cell edge region 410 due to the gaps 434 formed to section the dummy gate patterns 432 and the gaps 444 formed to section the dummy contact patterns 442, and to isolate the contact outer dummy gate 432o and outer dummy contact 442o from the inner dummy gate 432i/the inner dummy contact 442i in the dummy region 412 and the gate pattern 430 in the cell edge region 410. Briefly speaking, no impact will be introduced into the circuit devices formed in the cell edge region 410 even though the contact between the dummy gate patterns 432 and the dummy contact pattern 442 occurs.

According to the semiconductor layout structure provided by the present invention, the dummy gate patterns and the dummy contact patterns are alternately arranged. More important, each dummy contact pattern includes the inner dummy contact and the outer dummy contact, and/or each dummy gate pattern includes the inner dummy gate and the outer dummy gate. In other words, the dummy contact patterns and/or the dummy gate patterns are sectioned, respectively. Accordingly, in the case that the outer dummy contact is enlarged by OPC during the fabrication process or due to line-end effect/pattern density effect, a short circuit is formed by the outer dummy contact and the dummy gate pattern, and/or by the outer dummy contact and the outer dummy gate. However, the short circuit is isolated by the gap(s). Consequently, no impact will be introduced into the circuit devices formed in the cell region and the cell edge region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout structure comprising:
a substrate comprising a cell edge region and a dummy region abutting thereto;
a plurality of dummy contact patterns disposed in the dummy region and arranged along a first direction, each dummy contact pattern comprising an inner dummy contact proximal to the cell edge region and an outer dummy contact distal to the cell edge region, and the inner dummy contact and the outer dummy contact being arranged along a second direction perpendicular to the first direction and spaced apart from each other by a first gap; and
a plurality of dummy gate patterns disposed in the dummy region and arranged along the first direction, the dummy contact patterns and the dummy gate patterns being alternately arranged, wherein the dummy gate patterns comprising a plurality of sectioned dummy gate pairs and a plurality of continuous dummy gate pairs, and the sectioned dummy gate pairs and the continuous dummy gate pairs being alternately arranged pair by pair, and each of the sectioned dummy gate pairs comprises an inner dummy gate proximal to the cell edge region and an outer dummy gate distal to the cell edge region, the inner dummy gate and the outer dummy gate are arranged along the second direction and spaced apart from each other by a second gap; and a plurality of gate patterns disposed in the cell edge region and extended along the second direction, wherein at least one of the gate patterns in the cell edge region contacts the inner dummy gate.

2. The semiconductor layout structure according to claim 1, wherein a sum of a length of the outer dummy contact and a length of the inner dummy contact is smaller than a length of the dummy gate patterns.

3. The semiconductor layout structure according to claim 1, wherein a length of the outer dummy contact is smaller than a length of the outer dummy gate.

4. The semiconductor layout structure according to claim 1, further comprising a plurality of fin patterns disposed in the cell edge region, the fin patterns being extended along the first direction and arranged along the second direction.

5. The semiconductor layout structure according to claim 4, wherein the gate patterns cross the fin patterns.

6. The semiconductor layout structure according to claim 1, wherein the gate pattern in the cell edge region are spaced apart from each other in the second direction by a third gap.

7. The semiconductor layout structure according to claim 6, wherein a width of the third gap is equal to a width of the second gap.

8. The semiconductor layout structure according to claim 1, further comprising a plurality of contact patterns disposed in the cell edge region and extended along the second direction, and the contact patterns and the gate patterns being alternately arranged along the first direction.

9. The semiconductor layout structure according to claim 8, wherein at least a contact pattern contacts the inner dummy contact.

* * * * *